United States Patent
Mou et al.

(10) Patent No.: US 11,011,719 B2
(45) Date of Patent: May 18, 2021

(54) ELECTROLUMINESCENCE DEVICE, LIGHTING PANEL, AND VEHICLE LAMP GROUP

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xin Mou, Beijing (CN); Yuhsiung Feng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/385,260

(22) Filed: Apr. 16, 2019

(65) Prior Publication Data
US 2020/0067007 A1    Feb. 27, 2020

(30) Foreign Application Priority Data
Aug. 23, 2018  (CN) .......................... 201810965741.1

(51) Int. Cl.
*H01L 51/50*      (2006.01)
(52) U.S. Cl.
CPC ...... *H01L 51/5004* (2013.01); *H01L 51/5012* (2013.01); *H01L 51/5056* (2013.01);
(Continued)
(58) Field of Classification Search
CPC ............ H01L 51/5004; H01L 51/5012; H01L 51/5056; H01L 51/5096; H01L 51/5072
See application file for complete search history.

(56) References Cited

U.S. PATENT DOCUMENTS

2008/0091021 A1* 4/2008 Kwok .................. H01L 51/006
546/10
2013/0328038 A1* 12/2013 Taneda ................ H01L 51/0072
257/40
(Continued)

FOREIGN PATENT DOCUMENTS

CN          101562234 A       10/2009
CN          101800291 A        8/2010
(Continued)

OTHER PUBLICATIONS

First Office Action for CN Appl. No. 2018710965741.1, dated Jan. 10, 2020.
(Continued)

*Primary Examiner* — Cuong Q Nguyen
(74) *Attorney, Agent, or Firm* — The Webb Law Firm (57) ABSTRACT

The present disclosure relates to an electroluminescence device, a lighting panel and a vehicle lamp group. An electroluminescence device includes an anode, a cathode and a functional layer between the anode and the cathode, which includes: a light emitting layer; a first type carrier transport layer on a first side of the light emitting layer, configured to transport a first type carrier and a second type carrier and having a light emitting function; and a second type carrier block layer between the light emitting layer and the first type carrier transport layer, configured to block migration of the second type carrier when a working voltage is within a first voltage range and allow the second type carrier to cross the second type carrier block layer when the working voltage is within a second voltage range, within which any voltage value is greater than that within the first voltage range.

17 Claims, 5 Drawing Sheets

(52) U.S. Cl.
CPC ...... *H01L 51/5072* (2013.01); *H01L 51/5096* (2013.01); *H01L 2251/5361* (2013.01); *H01L 2251/552* (2013.01)

(56) References Cited

U.S. PATENT DOCUMENTS

2015/0311447 A1    10/2015    Kondakova et al.
2017/0092870 A1*  3/2017    Kim ................... H01L 51/5072

FOREIGN PATENT DOCUMENTS

| | | |
|---|---|---|
| CN | 104241540 A | 12/2014 |
| JP | 2005-150083 A | 6/2005 |
| KR | 20080057791 A | 6/2008 |

OTHER PUBLICATIONS

Wang, Fu-Zhi, "Study on Control of Energy and Charge Carriers in Organic Light-Emitting Devices", A Thesis submitted as partial fulfillment of Requirement for the Degree of Ph.D, Department of Polymer Science and Engineering, College of Chemistry and Molecular Engineering, Peking University, Beijing 100871. P.R. China, Apr. 2008.

* cited by examiner

ELECTROLUMINESCENCE DEVICE, LIGHTING PANEL, AND VEHICLE LAMP GROUP

CROSS-REFERENCE TO RELATED APPLICATIONS

This application claims priority to Chinese Patent Application No. 201810965741.1, filed on Aug. 23, 2018, the contents of which are hereby incorporated by reference in their entirety for all purposes.

TECHNICAL FIELD

The present disclosure relates to an electroluminescence (referred to as EL) device, a lighting panel, and a vehicle lamp group.

BACKGROUND

An organic light emitting diode (referred to as OLED) is widely used in small and medium size display fields due to its self-illumination, high efficiency, light weight, power saving and other advantages, and gradually enters the fields of large-area display and illumination, etc.

In the field of vehicle-mounted lighting, the OLEDs are also used as lamps for some uses on vehicles, such as vehicle taillights, brake lights or position lamps for providing indications, reading lamps for providing illumination, and the like. The lamps on the vehicles may be present specific colors depending on the uses. For example, the position lamps and brake lights are generally red, and the turn lights are generally amber.

SUMMARY

One aspect of the present disclosure provides an electroluminescence device, including an anode, a cathode, and a functional layer located between the anode and the cathode, wherein the functional layer includes: a light emitting layer; a first type carrier transport layer, located on a first side of the light emitting layer and configured to transport a first type carrier and a second type carrier; and a second type carrier block layer, located between the light emitting layer and the first type carrier transport layer and configured to block a migration of the second type carrier when a working voltage is within a first voltage range, wherein, the first type carrier transport layer has a light emitting function, and the second type carrier block layer is further configured to allow the second type carrier to cross the second type carrier block layer when the working voltage is within a second voltage range, so that the second type carrier enters the first type carrier transport layer and is recombined with the first type carrier in the first type carrier transport layer to emit light; and any voltage value within the second voltage range is greater than any voltage value within the first voltage range.

In some embodiments, a HOMO (Highest Occupied Molecular Orbital) energy level of the second type carrier block layer is less than the HOMO energy level of the first type carrier transport layer, and a LUMO (Lowest Unoccupied Molecular Orbital) energy level of the second type carrier block layer is greater than the LUMO energy level of the first type carrier transport layer.

In some embodiments, a light emitting wavelength range of the light emitting layer does not overlap with a light emitting wavelength range of the first type carrier transport layer.

In some embodiments, a ratio of a first type carrier mobility of the second type carrier block layer to a second type carrier mobility of the second type carrier block layer is greater than 50.

In some embodiments, a first type carrier mobility of the first type carrier transport layer is greater than or equal to the second type carrier mobility of the first type carrier transport layer.

In some embodiments, the first type carrier is electron, and the second type carrier is hole.

In some embodiments, a HOMO energy level of a light emitting host body of the light emitting layer is greater than a HOMO energy level of the second type carrier block layer by at least 0.7 eV.

In some embodiments, the first type carrier is hole, and the second type carrier is electron.

In some embodiments, a LUMO energy level of the second type carrier block layer is greater than the LUMO energy level of a light emitting host body of the light emitting layer by at least 0.7 eV.

In some embodiments, the first type carrier transport layer includes a first type carrier transport group, a second type carrier transport group, and a chromophore.

In some embodiments, the functional layer further includes: a second type carrier transport layer, located on a second side of the light emitting layer and configured to transport the second type carrier and the first type carrier, wherein the second side is a reverse side of the first side; and a first type carrier block layer, located between the light emitting layer and the second type carrier transport layer and configured to block the migration of the first type carrier when the working voltage is within a third voltage range, wherein the second type carrier transport layer has a light emitting function, and the first type carrier block layer is further configured to allow the first type carrier to cross the first type carrier block layer when the working voltage is within a fourth voltage range, so that the first type carrier enters the second type carrier transport layer and is recombined with the second type carrier in the second type carrier transport layer to emit light; and any voltage value within the fourth voltage range is greater than any voltage value within the third voltage range.

In some embodiments, light emitting wavelength ranges of at least two of the light emitting layer, the first type carrier transport layer or the second type carrier transport layer do not overlap.

In some embodiments, a HOMO energy level of the first type carrier block layer is less than the HOMO energy level of the second type carrier transport layer, and a LUMO energy level of the first type carrier block layer is greater than the LUMO energy level of the second type carrier transport layer.

In some embodiments, a second type carrier mobility of the second type carrier transport layer is greater than or equal to a first type carrier mobility of the second type carrier transport layer.

In some embodiments, the second type carrier transport layer includes a first type carrier transport group, a second type carrier transport group, and a chromophore.

One aspect of the present disclosure provides a lighting panel, including the aforementioned electroluminescence device.

In some embodiments, a color filter or a color filter lamp cover is arranged on the light emitting side of the electroluminescence device.

Another aspect of the present disclosure provides a vehicle lamp group, including: at least two aforementioned lighting panels.

BRIEF DESCRIPTION OF THE DRAWINGS

The drawings forming a part of the specification describe the embodiments of the present disclosure, and are used for explaining the principles of the present disclosure together with the specification.

The present disclosure can be more clearly understood according to the following detailed descriptions with reference to the drawings, wherein.

It should be understood that the dimensions of various parts shown in the drawings are not drawn according to the actual scale relationship. In addition, the same or similar reference numerals indicate the same or similar components.

DETAILED DESCRIPTION

Various exemplary embodiments of the present disclosure will now be described in detail with reference to the drawings. The descriptions of the exemplary embodiments are merely illustrative, and are never used as any limitation to the present disclosure or the application or use thereof. The present disclosure can be implemented in many different forms and is not limited to the embodiments described herein. These embodiments are provided to make the present disclosure be thorough and complete and to fully express the scope of the present disclosure to those skilled in the art. It should be noted that, unless otherwise specified, the relative arrangement of components and steps, the constituents of materials, numerical expressions and numerical values set forth in these embodiments should be construed as illustrative only and are not used as limitations.

The "first", "second" and similar words used in the present disclosure do not denote any order, quantity or importance, but are merely used for distinguishing different parts. Similar words such as "including" or "comprising" and the like are intended to mean that the elements in front of the word cover the elements listed behind the word, and the possibility of covering other elements is not excluded. "Upper", "lower", "left", "right" and the like are only used for indicating relative position relationships, and after an absolute position of a described object changes, the relative position relationships may be correspondingly changed.

In the present disclosure, when it is described that a particular device is located between a first device and a second device, there may be an intermediate device between the particular device and the first device or the second device, or there may be no intermediate device. When it is described that the particular device is connected to other devices, the particular device can be directly connected to the other devices and have no intermediate device, and can also be not directly connected to the other devices and have the intermediate device.

All terms (including technical terms or scientific terms) used in the present disclosure have the same meanings as understood by those of ordinary skill in the art to which the present disclosure belongs, unless specifically defined otherwise. It should also be understood that, the terms defined in, for example, a general dictionary, should be interpreted as having meanings consistent with their meanings in the context of related art, and should not be interpreted by idealized or extremely formal meanings, unless explicitly defined herein.

Techniques, methods and devices known to those of ordinary skill in the related art may not be discussed in detail, but the techniques, methods and devices should be considered as a part of the specification, where appropriate.

The inventors have found through researches that in some related arts, the color of light emitted from an OLED lighting panel is single, if lamp setting requirements for different uses on a vehicle need to be satisfied, a plurality of OLED lighting panels emitting different colors of light need to be used, so that the use adaptability is relatively poor.

In view of this, embodiments of the present disclosure provide an electroluminescence device, a lighting panel, and a vehicle lamp group, which can improve the use adaptability.

Figure 1:
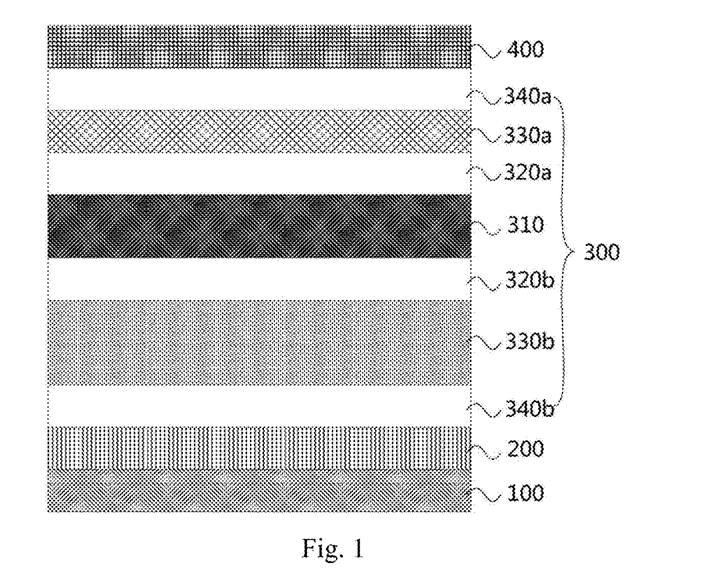
FIG. 1 is a structural schematic diagram according to one embodiment of an electroluminescence device of the present disclosure.

FIG. 1 is a structural schematic diagram according to one embodiment of an electroluminescence device of the present disclosure.

Referring to FIG. 1, in some embodiments, the electroluminescence device includes an anode 200, a cathode 400 and a functional layer 300 located between the anode 200 and the cathode 400. The anode 200 can be formed on a substrate 100. The functional layer 300 can include a hole inject layer 340$b$, a hole transport layer 330$b$, an electron block layer 320$b$, a light emitting layer 310, a hole block layer 320$a$, an electron transport layer 330$a$ and an electron inject layer 340$a$. In FIG. 1, these layers are stacked from the anode 200 to the cathode 400.

Different functional layer configurations can be selected in different embodiments. For example, in some embodiments, at least one of the electron block layer 320$b$ or the electron inject layer 340$a$ can be omitted. Or in some other embodiments, at least one of the hole block layer 320$a$ or the electron inject layer 340$a$ can be omitted.

In the functional layer 300, the light emitting layer 310 includes a light emitting host body and a light emitting guest body. In order to make the light emitting layer emit light in a specific wavelength, a suitable light emitting guest body can be selected according to design requirements, and a suitable thickness can also be selected according to the design requirements, for example, 20-80 nm.

Figure 2:
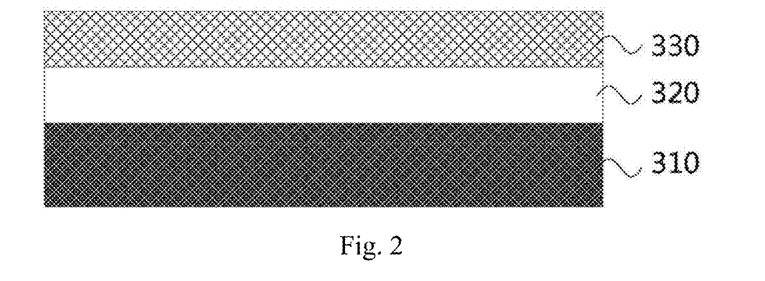
FIG. 2 is a schematic diagram of a local structure of a functional layer according to one embodiment of an electroluminescence device of the present disclosure.
Figure 3:
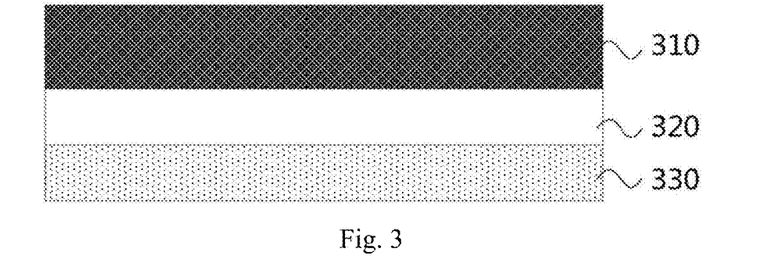
FIG. 3 is a schematic diagram of a local structure of a functional layer according to another embodiment of an electroluminescence device of the present disclosure.

FIG. 2 is a schematic diagram of a local structure of a functional layer according to one embodiment of an electroluminescence device of the present disclosure; and FIG. 3 is a schematic diagram of a local structure of a functional layer according to another embodiment of an electroluminescence device of the present disclosure.

Referring to FIG. 2 and FIG. 3 respectively, the functional layer 300 includes a light emitting layer 310, a first type carrier transport layer 330 and a second type carrier block layer 320. The first type carrier transport layer 330 is located on a first side of the light emitting layer 310 and is configured to transport a first type carrier and a second type carrier. The first side herein is an upper side of the light emitting layer 310 in FIG. 2, that is, one side of the light emitting layer 310 adjacent to the cathode 400, and it can be a lower side of the light emitting layer 310 in the embodiment of FIG. 3, that is, one side of the light emitting layer 310 adjacent to the anode 200.

The second type carrier block layer 320 is located between the light emitting layer 310 and the first type carrier transport layer 330 and is configured to block the migration of the second type carrier when the working voltage is within a first voltage range.

Referring to FIG. 1, when the first type carrier is electron and the second type carrier is hole, the electron transport layer 330a in FIG. 1 is the first type carrier transport layer 330 in FIG. 2, and the hole block layer 320a in FIG. 1 is the second type carrier block layer 320 in FIG. 2. When the first type carrier is hole and the second type carrier is electron, the hole transport layer 330b in FIG. 1 is the first type carrier transport layer 330 in FIG. 3, and the electron block layer 320b in FIG. 1 is the second type carrier block layer 320 in FIG. 3.

The first type carrier transport layer 330 is a bipolar transport layer that is capable of transporting both the first type carrier and the second type carrier (e.g., both the hole and the electron). Correspondingly, the first type carrier transport layer 330 can include a first type carrier transport group capable of transporting the first type carrier and a second type carrier transport group capable of transporting the second type carrier. For example, the electron transport group can be oxazole, trichloroazole, trichlorabenzene, thiazole and a thiazole derivative, and the hole transport group can be carbazole, triphenylamine or the like. In addition, the material of the first type carrier transport layer 330 can be a pure organic substance, and can also include a metal chelate such as 8-hydroxyquinoline aluminum or the like.

The electron transport layer (or the hole transport layer) in the related art is not only capable of transporting the electron (or hole), but also is capable of transporting another type carrier. In fact, the first carrier transport layer in the related art is mainly used for transporting the first type carrier, and the ability of transporting the first type carrier is much greater than the ability of transporting the second type carrier. Different from the first type carrier transport layer in the related art, the first type carrier transport layer 330 in the present embodiment is substantially equivalent in the transport ability of the first type carrier and the second type carrier. For the first type carrier transport layer 330, the first type carrier mobility (i.e., the mobility of the first type carriers in the first type carrier transport layer 330) can be equal to the second type carrier mobility. In some other embodiments, the first type carrier mobility of the first type carrier transport layer 330 can also be greater than the second type carrier mobility (i.e., the mobility of the second type carriers in the first type carrier transport layer 330), or the first type carrier mobility can be less than the second type carrier mobility.

The first type carrier transport layer 330 also has a light emitting function. Correspondingly, the first type carrier transport layer 330 can also include a chromophore (also referred to as a chromophore or a light emitting group) capable of emitting a particular color light. The second type carrier entering the first type carrier transport layer 330 is capable of being recombined with the first type carrier in the first type carrier transport layer 330 to emit light.

The second type carrier block layer 320 is located between the light emitting layer 310 and the first type carrier transport layer 330, and is configured to block the migration of the second type carrier when the working voltage is within the first voltage range and to allow the second type carrier to cross the second type carrier block layer 320 when the working voltage is within a second voltage range, so that the second type carrier enters the first type carrier transport layer 330 and is recombined with the first type carrier in the first type carrier transport layer 330 to emit light. Any voltage values within the second voltage range herein is greater than any voltage value within the first voltage range.

In other words, when the working voltage is within the lower first voltage range (e.g., 2 to 5.5V), a function of the second type carrier block layer 320 is to block the second type carrier on one side of the second type carrier block layer 320 adjacent to the light emitting layer 310 from migrating toward the first type carrier transport layer 330. Thus, it is difficult for the second type carrier to be recombined with the first type carrier in the layer to emit light. Under the action of the working voltage, the light emitting layer 310 emits light, and the first type carrier transport layer 330 does not emit light, then the light emitted from the electroluminescence device is the light emitted from the light emitting layer 310.

Of course, in some embodiments, the second type carrier block layer 320 cannot completely block the second type carrier from migrating toward the first type carrier transport layer 330 without leakage, thereby the first type carrier transport layer 330 emits weak light. At this time, the light emitted from the electroluminescence device is still mainly presented as the light emitted from the light emitting layer 310 with a small amount of light emitted from the first type carrier transport layer 330 mixed. If the color of the small amount of light is different from the color of the light emitted from the light emitting layer 310, it can be filtered by a corresponding color filter.

In order to increase the ability of the second type carrier block layer 320 to block the second type carrier when the working voltage is within the first voltage range, optionally, the ratio of the first type carrier mobility of the second type carrier block layer 320 to the second type carrier mobility of the second type carrier block layer 320 is greater than 50.

When the working voltage is within the higher second voltage range (e.g., 5.6 to 9V), the second type carrier is capable of crossing the second type carrier block layer 320 under the action of the higher working voltage, entering the first type carrier transport layer 330 and being recombined with the first type carrier in the first type carrier transport layer 330 to emit light. In this way, under the action of the working voltage, both the light emitting layer 310 and the first type carrier transport layer 330 emit light, such that the light emitted from the electroluminescence device is a mixed light of the light emitted from the light emitting layer 310 and the first type carrier transport layer 330, respectively.

In some embodiments, the electroluminescence device can be made to emit mixed light of a new color by making the light emitting wavelength range of the light emitting layer 310 not overlap with the light emitting wavelength range of the first type carrier transport layer 330. For example, the light emitting layer 310 includes a light emitting guest body material having a light emitting wavelength range of 615-640 nm, that is, the light emitting layer is capable of emitting red light. The light emitting wavelength range of the first type carrier transport layer 330 is 510-560 nm, that is, the first type carrier transport layer 330 is capable of emitting green or yellow-green light. When both the light emitting layer 310 and the first type carrier transport layer 330 emit light, the light emitted from both of them is mixed to obtain amber light. Thus, by setting different working voltages, the electroluminescence device is capable of emitting light of different colors.

In some other embodiments, the light emitting wavelength range of the light emitting layer 310 can partially or completely overlap with the light emitting wavelength range of the first type carrier transport layer 330, such that the electroluminescence device can obtain a wider light intensity range by setting different working voltages.

In addition, in order to enable the first type carrier to be smoothly transported from the first type carrier transport layer 330 to the second type carrier block layer 320 and to enable the second type carrier having crossed the second type carrier block layer 320 to enter the first type carrier transport layer 330 at the same time, an HOMO energy level of the second type carrier block layer 320 can be less than the HOMO energy level of the first type carrier transport layer 330, and a LUMO energy level of the second type carrier block layer 320 is greater than the LUMO energy level of the first type carrier transport layer 330.

In some embodiments, the HOMO energy level of the second type carrier block layer 320 can be less than the HOMO energy level of the first type carrier transport layer 330 by at least 0.2 eV. In other embodiments, the LUMO energy level of the second type carrier block layer 320 is greater than the LUMO energy level of the first type carrier transport layer 330 by at least 0.2 eV. This promotes the transport of the first type carrier and the second type carrier between the first type carrier transport layer 330 and the second type carrier block layer 320.

The above embodiments of the electroluminescence device of the present disclosure provide a first type carrier transport layer having the light emitting function and a bipolar transport function, and configure the second type carrier block layer to block or allow the second type carrier to pass within different voltage ranges, thereby the first type carrier transport layer does not emit light or only emits weak light at a lower voltage when the light emitting layer is normally emitting light, such that the light emitting of the electroluminescence device is presented as that the light emitting layer emits light. The first type carrier transport layer emits light at a higher voltage, such that the light emitting of the electroluminescence device is presented as that the light emitting layer and the first type carrier transport layer emit mixed light. Therefore, the light emitting performance of the electroluminescence device is expanded in the voltage control, accordingly the electroluminescence device has better use adaptability, and the corresponding working voltage can be configured according to actual needs to obtain the desired light emitting effect.

Figure 4:
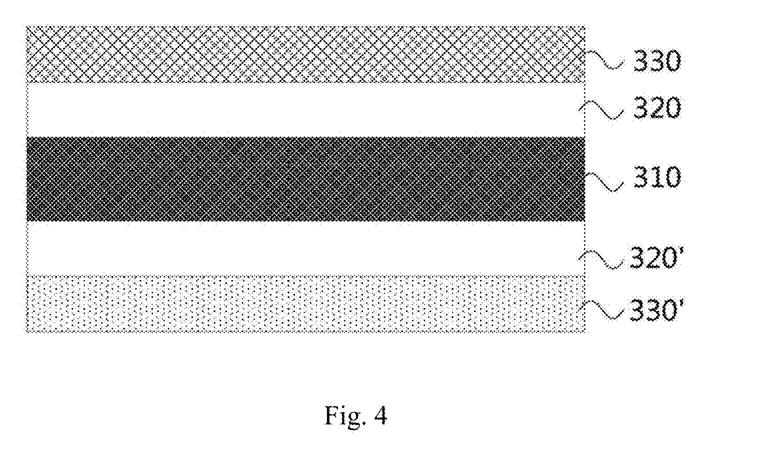
FIG. 4 is a schematic diagram of a local structure of a functional layer according to still another embodiment of an electroluminescence device of the present disclosure.

FIG. 4 is a schematic diagram of a local structure of a functional layer according to another embodiment of an electroluminescence device of the present disclosure.

Compared to the embodiment in FIG. 2, the functional layer 300 of the embodiment in FIG. 4 further includes a second type carrier transport layer 330' and a first type carrier block layer 320'. The second type carrier transport layer 330' is located on a second side of the light emitting layer 310 and is configured to transport the second type carrier and the first type carrier. The second side here is a reverse side of the first side of the light emitting layer 310 in the previous embodiments. Referring to FIG. 2 and FIG. 4, the first type carrier transport layer 330 is located on the upper side of the light emitting layer 310 (i.e., the first side which is one side of the light emitting layer 310 adjacent to the cathode 400), and the second type carrier transport layer 330' is located on the lower side of the light emitting layer 310 (i.e., the second side which is one side of the light emitting layer 310 adjacent to the anode 200).

Referring to FIG. 1, when the first type carrier is electron and the second type carrier is hole, the electron transport layer 330*a* in FIG. 1 is the first type carrier transport layer 330 in FIG. 4, the hole block layer 320*a* in FIG. 1 is the second type carrier block layer 320 in FIG. 4, the hole transport layer 330*b* in FIG. 1 is the second type carrier transport layer 330' in FIG. 4, and the electron block layer 320*b* in FIG. 1 is the first type carrier block layer 320' in FIG. 4.

When the first type carrier is hole and the second type carrier is electron, the hole transport layer 330*b* in FIG. 1 is the first type carrier transport layer 330 in FIG. 4, the electron block layer 320*b* in FIG. 1 is the second type carrier block layer 320 in FIG. 4, the electron transport layer 330*a* in FIG. 1 is the second type carrier transport layer 330' in FIG. 4, and the hole block layer 320*a* in FIG. 1 is the first type carrier block layer 320' in FIG. 4. Correspondingly, the first type carrier transport layer 330 is located on one side of the light emitting layer 310 adjacent to the anode (i.e., the first side), and the second type carrier transport layer 330' is located on one side of the light emitting layer 310 adjacent to the cathode (i.e., the second side).

The second type carrier transport layer 330' is a bipolar transport layer that is capable of both transporting the first type carrier and the second type carrier (e.g., the hole and the electron). Correspondingly, the second type carrier transport layer 330' can include a first type carrier transport group capable of transporting the first type carrier and a second type carrier transport group capable of transporting the second type carrier. For example, the electron transport group can be oxazole, trichloroazole, trichlorabenzene, thiazole and a thiazole derivative, and the hole transport group can be carbazole, triphenylamine or the like. In addition, the material of the second type carrier transport layer 330' can be a pure organic substance, and can also include a metal chelate such as 8-hydroxyquinoline aluminum or the like.

For the second type carrier transport layer 330', the first type carrier mobility is equal to the second type carrier mobility. In some other embodiments, the second type carrier mobility of the second type carrier transport layer 330' can also be greater than the first type carrier mobility of the second type carrier transport layer 330'.

The second type carrier transport layer 330' also has a light emitting function. Correspondingly, the second type carrier transport layer 330' can also include a chromophore capable of emitting a particular color light. The first type carrier entering the second type carrier transport layer 330' is capable of being recombined with the second type carrier in the second type carrier transport layer 330' to emit light.

The first type carrier block layer 320' is located between the light emitting layer 310 and the second type carrier transport layer 330', and is configured to block the migration of the first type carrier when the working voltage is within a third voltage range and to allow the first type carrier to cross the first type carrier block layer 320' when the working voltage is within a fourth voltage range, so that the first type carrier enters the second type carrier transport layer 330' and is recombined with the second type carrier in the second type carrier transport layer 330' to emit light. Any voltage values within the fourth voltage range herein is greater than any voltage value within the third voltage range.

In other words, when the working voltage is within the lower third voltage range (e.g., 2 to 5.5V), a function of the first type carrier block layer 320' is to block the first type carrier on one side of the first type carrier block layer 320' adjacent to the light emitting layer 310 from migrating toward the second type carrier transport layer 330'. Thus, it is difficult for the first type carrier to be recombined with the second type carrier in the second type carrier transport layer 330' to emit light.

In order to increase the ability of the first type carrier block layer 320' to block the first type carrier when the working voltage is within the third voltage range, optionally, the ratio of the second type carrier mobility of the first type carrier block layer 320' to the first type carrier mobility of the first type carrier block layer 320' is greater than 50.

When the working voltage is within the higher fourth voltage range (e.g., 5.6 to 9V), the first type carrier is capable of crossing the first type carrier block layer 320' under the action of the higher working voltage, entering the second type carrier transport layer 330' and being recombined with the second type carrier in the second type carrier transport layer 330' to emit light.

Under different voltage ranges, a plurality of light emitting modes can be formed, for example, the light emitting layer 310 singly emits light or mainly emits light, both of the light emitting layer 310 and the first type carrier transport layer 330 emit light, both of the light emitting layer 310 and the second type carrier transport layer 330' emit light, and all of the light emitting layer, the first type carrier transport layer 330 and the second type carrier transport layer 330' emit light. It should be noted that, the light emitting layer 310 mainly emitting light herein means that the second type carrier block layer 320 cannot completely block the second type carrier from migrating to the first type carrier transport layer 330 without leakage, and/or, the first type carrier block layer 320' cannot completely block the first type carrier from migrating to the second type carrier transport layer 330' without leakage, thus making the light emitted from the electroluminescence device is presented as the mixed light of the light emitted from the light emitting layer 310 and the weak light (for example, the light intensity is about 1/50 of the light intensity of the light emitting layer 310) emitted from the first type carrier transport layer 330 and/or the second type carrier transport layer 330'.

In some embodiments, the electroluminescence device can be made to emit mixed light in a new color by making the light emitting wavelength ranges of at least two of the light emitting layer 310, the first type carrier transport layer 330 or the second type carrier transport layer 330' not overlap with each other. For example, the light emitting layer 310 includes a light emitting guest body material having a light emitting wavelength range of 615-640 nm, that is, the light emitting layer is capable of emitting red light; the light emitting wavelength range of the first type carrier transport layer 330 is 510-560 nm, that is, the first type carrier transport layer 330 is capable of emitting green or yellow-green light; and the light emitting wavelength range of the second type carrier transport layer 330' is 445-470 nm, that is, the second type carrier transport layer 330' is capable of emitting blue light.

Thus, by setting the working voltage within different voltage ranges, the electroluminescence device is capable of emitting red light, amber light or magenta light, and even white light. In addition, by making the light emitting wavelength ranges of the light emitting layer, the first type carrier transport layer and the second type carrier transport layer not overlap with each other, the light emitting wavelength range of the electroluminescence device can be increased to achieve higher adaptability. The first voltage range and the third voltage range may not overlap, partially overlap or be the same, and the second voltage range and the fourth voltage range may not overlap, partially overlap or be the same.

In other embodiments, the light emitting wavelength range of the light emitting layer 310 may partially overlap or completely overlap with the light emitting wavelength range of the first type carrier transport layer 330 or the second type carrier transport layer 330'. Thus, by setting different working voltages, the electroluminescence device can obtain a wider light intensity range.

In addition, in order to enable the second type carrier to be smoothly transported from the second type carrier transport layer 330' to the first type carrier block layer 320' and to enable the second type carrier having crossed the first type carrier block layer 320' to enter the second type carrier transport layer 330' at the same time, the HOMO energy level of the first type carrier block layer 320' can be less than the HOMO energy level of the second type carrier transport layer 330', and the LUMO energy level of the first type carrier block layer 320' is greater than the LUMO energy level of the second type carrier transport layer 330'. In some embodiments, optionally, the HOMO energy level of the first type carrier block layer 320' is less than the HOMO energy level of the second type carrier transport layer 330' by at least 0.2 eV. In other embodiments, the LUMO energy level of the first type carrier block layer 320' is greater than the LUMO energy level of the second type carrier transport layer 330' by at least 0.2 eV, in order to promote the transport of the second type carrier and the first type carrier between the second type carrier transport layer 330' and the first type carrier block layer 320'.

Figure 5:
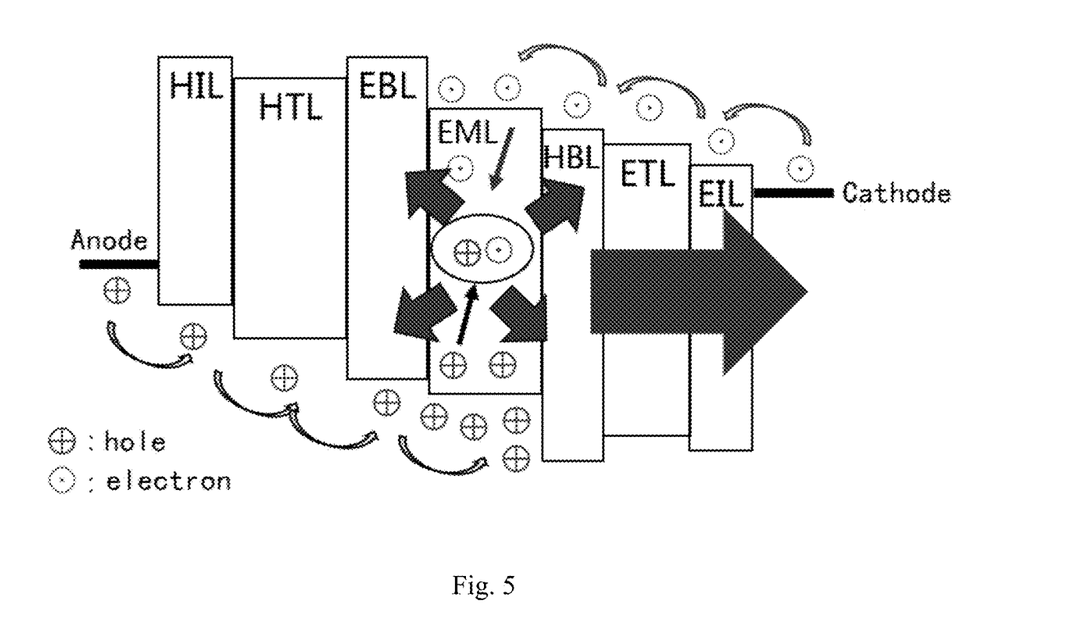
FIG. 5 is a schematic diagram of a light emitting principle within a lower working voltage range according to one embodiment of an electroluminescence device of the present disclosure.
Figure 6:
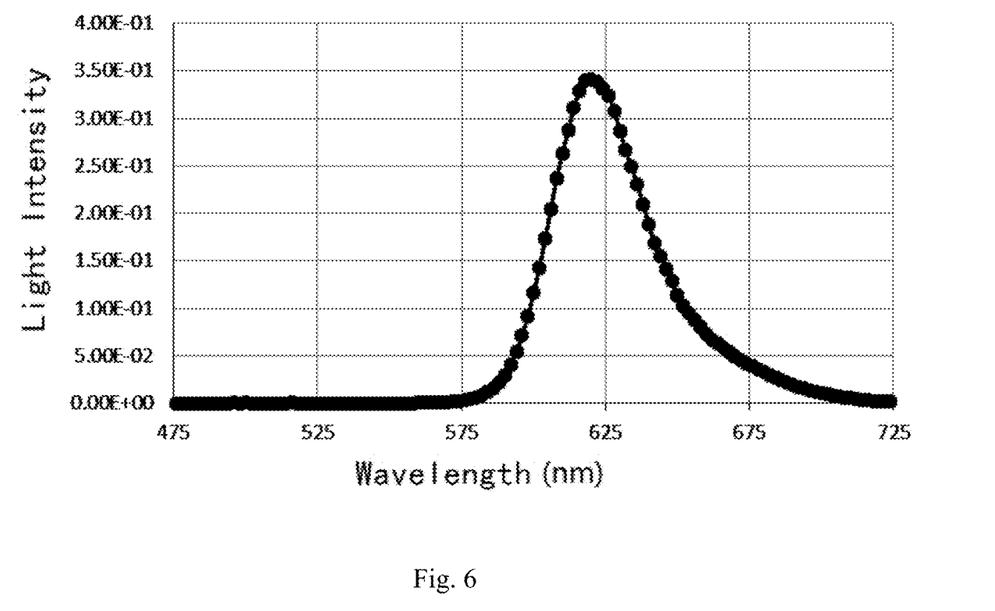
FIG. 6 is a light emitting spectrogram of the embodiment in FIG. 5.
Figure 7:
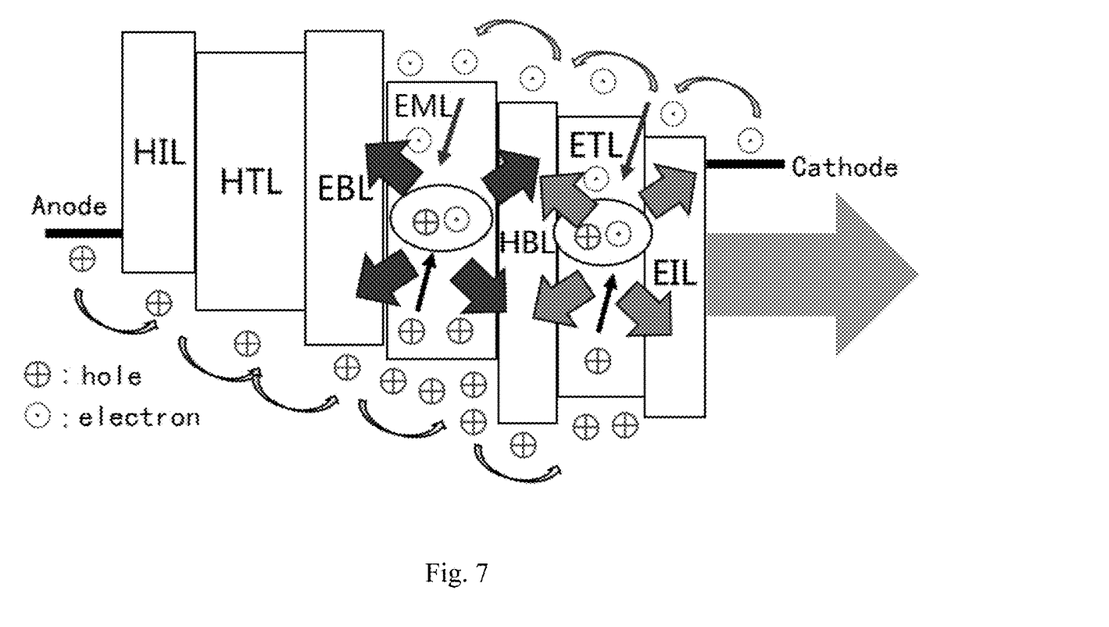
FIG. 7 is a schematic diagram of a light emitting principle within a higher working voltage range according to one embodiment of an electroluminescence device of the present disclosure.
Figure 8:
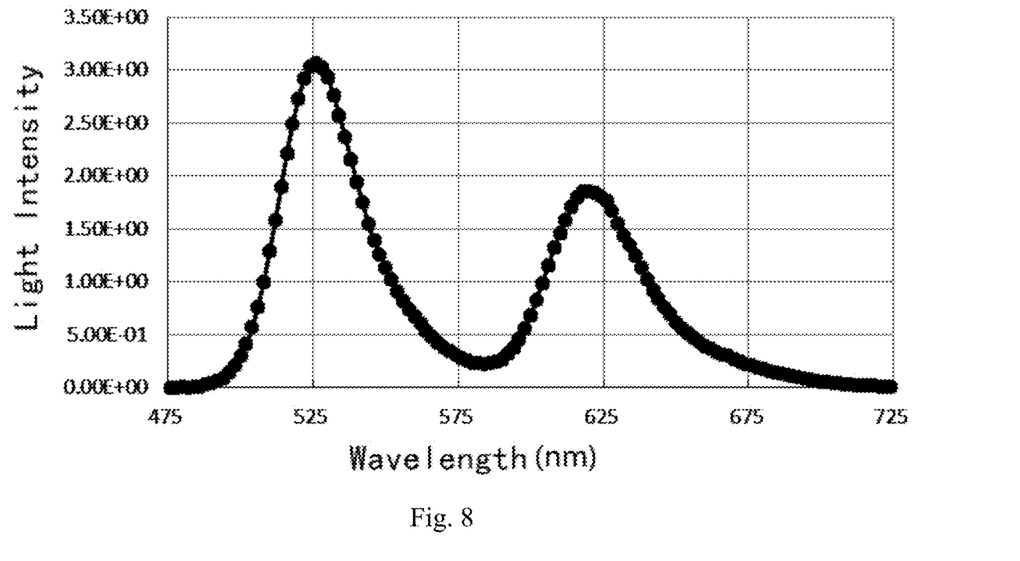
FIG. 8 is a light emitting spectrogram of the embodiment in FIG. 7.

FIG. 5 and FIG. 7 are respectively schematic diagrams of a light emitting principle within a lower working voltage range and a higher working voltage range according to some embodiments of an electroluminescence device of the present disclosure. FIG. 6 and FIG. 8 are respectively light emitting spectrograms of an embodiment of FIG. 5 and an embodiment of FIG. 7.

Referring to FIG. 5 and FIG. 7, the anode, the hole inject layer (referred to as HIL), the hole transport layer (referred to as HTL), the electron block layer (referred to as EBL), the light emitting layer (referred to as EML), the hole block layer (referred to as HBL), the electron transport layer (referred to as ETL), the electron inject layer (referred to as EIL) and the cathode are respectively located from left to right. In some embodiments, the electroluminescence device may not include at least one of the electron block layer or the electron inject layer.

The light emitting layer can include a light emitting host body and a light emitting guest body that emits red light, and the light emitting wavelength of the light emitting guest body is 615-640 nm. The host body material of the light emitting layer can be Bis(10-hydroxybenzo[h]quinolinato)berylli (also called as Bebq2), and the guest body material can be bis(2-methyldibenzo[f,h]quinoxaline)(acetylacetonate)iridium(III) (also called as Ir(MDQ)2(acac)), the doping concentration of the guest body material is 3% to 10%, and the thickness of the light emitting layer can be set as 20-80 nm, for example, 40 nm. The hole block layer optionally has a deeper HOMO energy level, and its HOMO energy level can be less than −6 eV. In addition, the electron mobility of the hole block layer can be $10^{-6}$-$10^{-4}$ $cm^2Ns$, and the hole mobility can be $10^{-5}$-$10^{-7}$ $cm^2Ns$. The ratio of the electron mobility to the hole mobility of the hole block layer can be greater than 50. The material of the hole block layer can be 1,3,5-tris(1-phenyl-1H-benzimidazol-2-yl)benzene (also called as TPBi), and the thickness of the hole block layer is optionally 5-15 nm.

In addition, the material of the anode is, for example, ITO/Ag/ITO, and the thickness can be set as 0.5-3.5/50-250/0.5-3.5 nm. The material of the cathode is, for example, Mg:Ag (1:50 to 50:1), and the thickness can be set as 5-35 nm. The material of the hole inject layer is, for example, 2,3,6,7,10,11-hexacyano-1,4,5,8,9,12-hexaazatriphenylene (also called as HAT-CN), and the thickness can be set as 3-25 nm. The material of the hole transport layer is, for example, N,N'-Di-[(1-naphthalenyl)-N,N'-diphenyl]-1,1'-biphenyl)-4,4'-diamine (also called as NPB), and the thickness can be set as 5-250 nm. The material of the electron inject layer is, for example, LiF, and the thickness can be set as 0.5-2 nm.

The relationship between the HOMO energy level of the light emitting host body of the light emitting layer 310 and the HOMO energy level of the hole block layer can be determined according to factors such as the hole mobility of the hole block layer, the working voltage and the like. Optionally, the HOMO energy level of the light emitting host body of the light emitting layer 310 is greater than the HOMO energy level of the hole block layer by at least 0.5 eV, and optionally by at least 0.7 eV.

The electron mobility of the electron transport layer can be $10^{-6}$-$10^{-4}$ $cm^2Ns$, and its electron mobility can be less than that of the hole block layer. The light emitted from the electron transport layer can be green light or yellow-green light, and the emitting wavelength is 510-560 nm. The material of the electron transport layer is, for example, tris(8-hydroxyquinoline)aluminum (also called as AlQ3), the film thickness of the layer can be 15-50 nm, for example, 35 nm. The electron transport layer has an electron transport function, a hole transport function and a light emitting function. Correspondingly, the LUMO energy level of the electron transport layer is less than the LUMO energy level of the hole block layer, and optionally, the LUMO energy level is less than the LUMO energy level of the hole block layer by 0.2 eV, so that the electron can be smoothly transported to the hole block layer. Furthermore, the HOMO energy level of the electron transport layer is also less than the HOMO energy level of the hole block layer. Optionally, the HOMO energy level of the electron transport layer is less than the HOMO energy level of the hole block layer by 0.2 eV, so that when the working voltage is at the higher second voltage range (for example, 6-9V), hole can enter the electron transport layer after crossing the hole block layer to be recombined with the electron in the electron transport layer to emit light.

In order to enable the electron transport layer to emit green light or yellow-green light, the electron transport layer further includes a green chromophore, such as coumarin, quinacridone, quinoline, phenylpyridine and other groups in addition to the electron transport group and the hole transport group.

Referring to FIG. 5 and FIG. 7, by designing the HOMO energy level difference between the light emitting host body of the foregoing light emitting layer and the hole block layer, when the working voltage is within the lower first voltage range (for example, 2-5.5V), the hole cannot cross (or only a small part crosses) the HOMO energy level of the hole block layer, thus making the light (a large dark color arrow on the right side of FIG. 5) emitted from the electroluminescence device at the working voltage be mainly presented as the red light (a plurality of small dark color arrows with EML as the center in FIG. 5) emitted by the light emitting layer.

Due to the HOMO energy level difference, when the working voltage is within the higher second voltage range (for example, 5.6-9V), the hole can cross the HOMO energy level of the hole block layer, so that when the light emitting layer emits the red light, the hole having crossed the hole block layer can be recombined with the electron in the electron transport layer to emit the green light, therefore the light (a large light color arrow on the right side of FIG. 7) emitted from the electroluminescence device at the working voltage is presented as amber light obtained by mixing the red light (a plurality of small dark color arrows with EML as the center in FIG. 7) emitted from the light emitting layer with the green light (a plurality of small light color arrows with EML as the center in FIG. 7) emitted from the electron transport layer.

FIG. 6 is compared with FIG. 8, when the working voltage is within the lower first voltage range, the light emitting spectrogram of the electroluminescence device in FIG. 6 presents a crest shape of the light intensity within the wavelength range of 615-640 nm, which indicates that the electroluminescence device emits the red light. When the working voltage is within the higher second voltage range, the light emitting spectrogram of the electroluminescence device in FIG. 8 presents two crest shapes of light intensities within the wavelength ranges of 615-640 nm and 510-560 nm, which indicates that the electroluminescence device emits the mixed light of the red light and the green light at this time.

Figure 9:
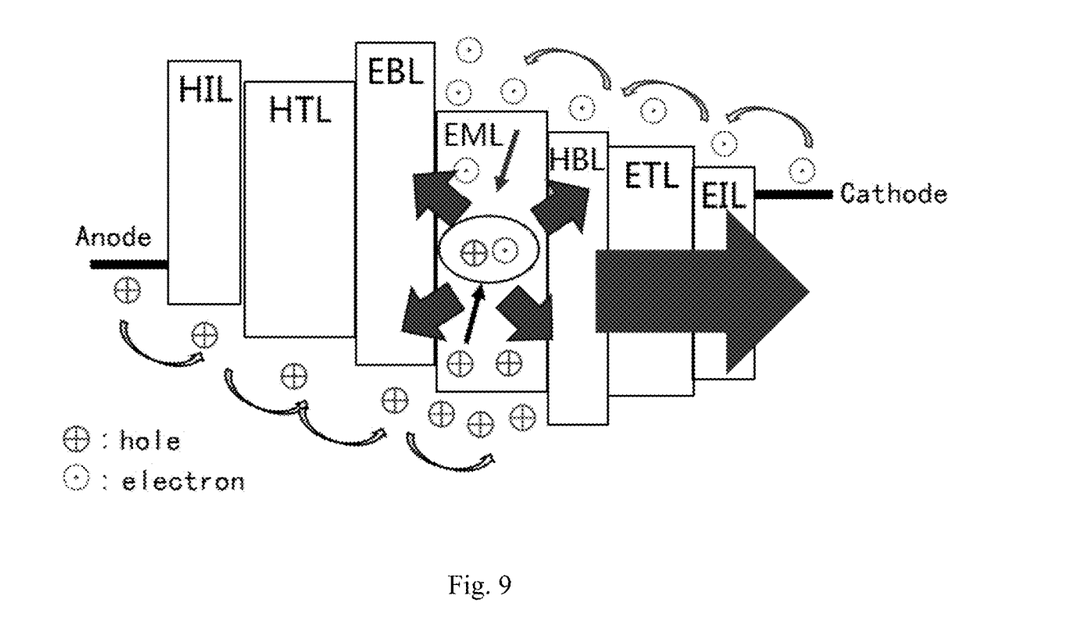
FIG. 9 is a schematic diagram of a light emitting principle within a lower working voltage range according to another embodiments of an electroluminescence device of the present disclosure.
Figure 10:
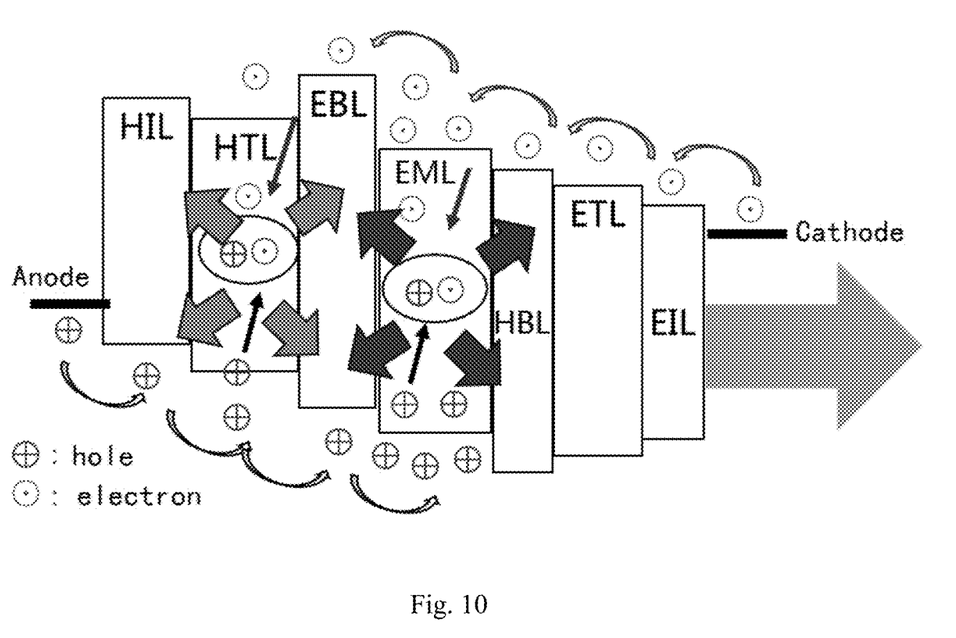
FIG. 10 is a schematic diagram of a light emitting principle within a higher working voltage range according to another embodiments of an electroluminescence device of the present disclosure.

FIG. 9 and FIG. 10 are respectively light emitting principles within a lower working voltage range and a higher working voltage range according to some other embodiments of an electroluminescence device of the present disclosure.

Referring to FIG. 9 and FIG. 10, the anode, the hole inject layer (HIL), the hole transport layer (HTL), the electron block layer (EBL), the light emitting layer (EML), the hole block layer (HBL), the electron transport layer (ETL), the electron inject layer (EIL) and the cathode are respectively located from left to right. In some embodiments, the electroluminescence device may not include at least one of the hole block layer or the electron inject layer.

The light emitting layer can include a light emitting host body and a light emitting guest body that emits red light, and the light emitting wavelength of the light emitting guest body is 615-640 nm. The thickness of the light emitting layer can be set as 20-80 nm, for example, 40 nm. The electron block layer optionally has a higher LUMO energy level, and its LUMO energy level can be greater than −3.0 eV. In addition, the hole mobility of the electron block layer can be $10^{-5}$-$10^{-3}$ $cm^2Ns$, and the electron mobility can be $10^{-4}$-$10^{-6}$ $cm^2$Ns. The ratio of the hole mobility of the electron block layer to the electron mobility of the electron block layer can be greater than 50.

The relationship between the LUMO energy level of the light emitting host body of the light emitting layer 310 and the LUMO energy level of the electron block layer can be determined according to factors such as the electron mobility of the electron block layer, the working voltage and the like. Optionally, the LUMO energy level of the light emitting host body of the light emitting layer 310 is less than the LUMO energy level of the electron block layer by at least 0.3 eV, optionally by at least 0.5 eV, and further optionally by at least 0.7 eV.

The hole mobility of the hole transport layer can be $10^{-5}$-$10^{-3}$ $cm^2$Ns, and its hole mobility can be greater than that of the electron block layer. The light emitted from the hole transport layer can be green light or yellow-green light, and the emitting wavelength is 550-560 nm. The film thickness of the layer can be 15-50 nm. The hole transport layer has an electron transport function, a hole transport function and a light emitting function. Correspondingly, the HOMO energy level of the hole transport layer is less than the HOMO energy level of the electron block layer, and optionally, the HOMO energy level is less than the HOMO energy level of the electron block layer by 0.2 eV, so that the hole can be smoothly transported to the electron block layer. Furthermore, the LUMO energy level of the hole transport layer is less than the LUMO energy level of the electron block layer, optionally, the LUMO energy level of the hole transport layer is less than the LUMO energy level of the electron block layer by 0.2 eV, so that when the working voltage is at the higher second voltage range (for example, 6-9V), the electron can enter the hole transport layer after crossing the electron block layer to be recombined with the electron in the hole transport layer to emit light.

In order to enable the hole transport layer to emit green light or yellow-green light, the hole transport layer further includes a green chromophore, such as coumarin, quinacridone, quinoline, phenylpyridine and other groups in addition to the electron transport group and the hole transport group.

Referring to FIG. 9 and FIG. 10, by designing the LUMO energy level difference between the electron block layer and the light emitting host body of the foregoing light emitting layer, when the working voltage is within the lower first voltage range (for example, 2-5.5V), the electron cannot cross (or only a small part crosses) the LUMO energy level of the electron block layer, thus making the light (a large dark color arrow on the right side of FIG. 9) emitted from the electroluminescence device at the working voltage is mainly presented as the red light (a plurality of small dark color arrows with EML as the center in FIG. 9) emitted by the light emitting layer.

Due to the LUMO energy level difference, when the working voltage is within the higher second voltage range (for example, 5.6-9V), the electron can cross the LUMO energy level of the electron block layer, so that when the light emitting layer emits the red light, the electron crossing the electron block layer can be recombined with the hole in the hole transport layer to emit the green light, therefore the light (a large light color arrow on the right side of FIG. 10) emitted from the electroluminescence device at the working voltage is presented as amber light obtained by mixing the red light (a plurality of small dark color arrows with EML as the center in FIG. 10) emitted from the light emitting layer with the green light (a plurality of small light color arrows with EML as the center in FIG. 10) emitted from the hole transport layer.

It should be noted that, a top emission mode (i.e., the light is emitted from the cathode side) adopted by the electroluminescence device of the present disclosure illustrated in FIG. 5, FIG. 7, FIG. 9 and FIG. 10 can also be replaced by a bottom emission mode (i.e., the light is emitted from the anode side). The embodiments of the present disclosure can also employ a transparent electroluminescence device that emits light from both the cathode side and the anode side.

The embodiments of the above electroluminescence device (e.g., OLED or the like) can be applied to a lighting device or an image display device. The present disclosure provides an embodiment of a lighting panel, including the any embodiment of the foregoing electroluminescence devices, and different display effects can be achieved based on different working voltages. In the case that the color of the light emitted from the light emitting layer is different from the color of the light emitted from the first type carrier transport layer and/or the second type carrier transport layer, the lighting panel is capable of emitting light of different colors at different working voltages, thereby improving the use adaptability of the lighting panel. In this way, by changing the working voltage of the lighting panel, the lighting panel can display light of different colors to meet various requirements of lighting, indication, decoration and the like.

In order to improve the light emitting purity of the lighting panel at a lower working voltage, a color filter or a color filter lampshade can be arranged on the light emitting side of the electroluminescence device, and the light of other colors emitted from the first type carrier transport layer and/or the second type carrier transport layer can be filtered by the color filter or the color filter lampshade so as to obtain high-purity color light emitted from the light emitting layer.

The above lighting panel embodiments can be applied to a vehicle to serve as a lighting lamp or indicator lamp. The present disclosure also provides an embodiment of a vehicle lamp group, including at least two foregoing lighting panels. In the at least two foregoing lighting panels, the working voltage of each of the at least two lighting panels is within the first voltage range or the second voltage range. For example, a part of the lighting panels (emitting red light) can be used as a vehicle position lamp or a brake lamp, and the working voltage used is within the first voltage range. The other part of the lighting panels (emitting amber light) can be used as a vehicle steering lamp, and the working voltage used is within the second voltage range. In this way, in the face of the lamp setting requirements for different uses on the vehicle, it is not necessary to use a plurality of electroluminescence devices emitting light of different colors, and a plurality of identical foregoing lighting panels can be adopted, and the lighting panels are configured to work within the corresponding working voltage ranges. In addition, for the lighting panel serving as the vehicle position lamp or the brake lamp, in order to obtain red light with higher purity, a red light color filter or a red light color filter lampshade can be arranged on the light emitting side of the electroluminescence device.

So far, various embodiments of the present disclosure have been described in detail. In order to avoid obscuring the concepts of the present disclosure, some details known in the art are not described. Those skilled in the art can fully understand how to implement the technical solutions disclosed herein based on the above descriptions.

Although some specific embodiments of the present disclosure have been described in detail by way of examples, those skilled in the art should understand that the above embodiments may merely for the purpose of illustration, rather than limiting the scope of the present disclosure. Those skilled in the art should understand that the above embodiments can be modified or a part of technical features can be equivalently substituted without departing from the scope and spirit of the present disclosure. The scope of the present disclosure is defined by the appended claims.

What is claimed is:

1. An electroluminescence device, comprising an anode, a cathode, and a functional layer located between the anode and the cathode, wherein the functional layer comprises:
   a light emitting layer;
   a first type carrier transport layer, located on a first side of the light emitting layer and configured to transport a first type carrier and a second type carrier, the first type carrier transport layer comprising a first type carrier transport group, a second type carrier transport group, and a chromophore; and
   a second type carrier block layer, located between the light emitting layer and the first type carrier transport layer and configured to block a migration of the second type carrier when a working voltage is within a first voltage range,
   wherein the first type carrier transport layer has a light emitting function, and the second type carrier block layer is further configured to allow the second type carrier to cross the second type carrier block layer when the working voltage is within a second voltage range, so that the second type carrier enters the first type carrier transport layer and is recombined with the first type carrier in the first type carrier transport layer to emit light; and
   any voltage value within the second voltage range is greater than any voltage value within the first voltage range.

2. The electroluminescence device according to claim 1, wherein a HOMO energy level of the second type carrier block layer is less than the HOMO energy level of the first type carrier transport layer, and a LUMO energy level of the second type carrier block layer is greater than the LUMO energy level of the first type carrier transport layer.

3. The electroluminescence device according to claim 1, wherein a light emitting wavelength range of the light emitting layer does not overlap with a light emitting wavelength range of the first type carrier transport layer.

4. The electroluminescence device according to claim 1, wherein a ratio of a first type carrier mobility of the second type carrier block layer to a second type carrier mobility of the second type carrier block layer is greater than 50.

5. The electroluminescence device according to claim 1, wherein a first type carrier mobility of the first type carrier transport layer is greater than or equal to a second type carrier mobility of the first type carrier transport layer.

6. The electroluminescence device according to claim 1, wherein the first type carrier is electron, and the second type carrier is hole.

7. The electroluminescence device according to claim 6, wherein a HOMO energy level of a light emitting host body of the light emitting layer is greater than a HOMO energy level of the second type carrier block layer by at least 0.7 eV.

8. The electroluminescence device according to claim 1, wherein the first type carrier is hole, and the second type carrier is electron.

9. The electroluminescence device according to claim 8, wherein a LUMO energy level of the second type carrier block layer is greater than the LUMO energy level of a light emitting host body of the light emitting layer by at least 0.7 eV.

10. The electroluminescence device according to claim 1, wherein the functional layer further comprises:
    a second type carrier transport layer, located on a second side of the light emitting layer and configured to transport the second type carrier and the first type carrier, wherein the second side is a reverse side of the first side; and
    a first type carrier block layer, located between the light emitting layer and the second type carrier transport layer and configured to block the migration of the first type carrier when the working voltage is within a third voltage range,
    wherein the second type carrier transport layer has a light emitting function, and the first type carrier block layer is further configured to allow the first type carrier to cross the first type carrier block layer when the working voltage is within a fourth voltage range, so that the first type carrier enters the second type carrier transport layer and is recombined with the second type carrier in the second type carrier transport layer to emit light; and
    any voltage value within the fourth voltage range is greater than any voltage value within the third voltage range.

11. The electroluminescence device according to claim 10, wherein light emitting wavelength ranges of at least two of the light emitting layer, the first type carrier transport layer or the second type carrier transport layer do not overlap.

12. The electroluminescence device according to claim 10, wherein a HOMO energy level of the first type carrier block layer is less than the HOMO energy level of the second type carrier transport layer, and a LUMO energy level of the first type carrier block layer is greater than the LUMO energy level of the second type carrier transport layer.

13. The electroluminescence device according to claim 10, wherein a second type carrier mobility of the second type carrier transport layer is greater than or equal to a first type carrier mobility of the second type carrier transport layer.

14. The electroluminescence device according to claim 10, wherein the second type carrier transport layer comprises a first type carrier transport group, a second type carrier transport group, and a chromophore.

15. A lighting panel, comprising the electroluminescence device according to claim 1.

16. The lighting panel according to claim 15, wherein a color filter or a color filter lamp cover is arranged on a light emitting side of the electroluminescence device.

17. A vehicle lamp group, comprising: at least two lighting panels according to claim 15.

* * * * *

UNITED STATES PATENT AND TRADEMARK OFFICE
CERTIFICATE OF CORRECTION

PATENT NO. : 11,011,719 B2
APPLICATION NO. : 16/385260
DATED : May 18, 2021
INVENTOR(S) : Mou et al.

Page 1 of 1

It is certified that error appears in the above-identified patent and that said Letters Patent is hereby corrected as shown below:

On the Title Page

Item [30], Delete "2018710965741.1," and insert -- 201810965741.1 --

Signed and Sealed this
Third Day of August, 2021

Drew Hirshfeld
*Performing the Functions and Duties of the*
*Under Secretary of Commerce for Intellectual Property and*
*Director of the United States Patent and Trademark Office*